(12) United States Patent
Jiang

(10) Patent No.: US 10,312,130 B2
(45) Date of Patent: Jun. 4, 2019

(54) LTPS ARRAY SUBSTRATE, METHOD FOR MANUFACTURING THE SAME, AND DISPLAY DEVICE

(71) Applicant: Shenzhen China Star Optoelectronics Technology Co., Ltd., Shenzhen (CN)

(72) Inventor: Yaru Jiang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 20 days.

(21) Appl. No.: 14/897,325

(22) PCT Filed: Aug. 5, 2015

(86) PCT No.: PCT/CN2015/086122
§ 371 (c)(1),
(2) Date: Nov. 3, 2017

(87) PCT Pub. No.: WO2017/015980
PCT Pub. Date: Feb. 2, 2017

(65) Prior Publication Data
US 2018/0144972 A1    May 24, 2018

(30) Foreign Application Priority Data
Jul. 27, 2015 (CN) .......................... 2015 1 0447288

(51) Int. Cl.
*H01L 21/71* (2006.01)
*H01L 27/15* (2006.01)
(Continued)

(52) U.S. Cl.
CPC ................ *H01L 21/71* (2013.01); *G02F 1/13* (2013.01); *H01L 27/1248* (2013.01);
(Continued)

(58) Field of Classification Search
CPC . H01L 21/71; H01L 21/1248; H01L 27/1259; H01L 27/153
See application file for complete search history.

(56) References Cited

U.S. PATENT DOCUMENTS

| 4,045,312 A * | 8/1977 | Satoshi | C25F 3/02 205/666 |
|---|---|---|---|
| 2007/0099094 A1 | 5/2007 | Nemoto et al. | |

(Continued)

FOREIGN PATENT DOCUMENTS

| CN | 101101347 A | 1/2008 |
|---|---|---|
| CN | 101592752 A | 12/2009 |

(Continued)

OTHER PUBLICATIONS

Notification of Transmittal of the International Search Report and the Written Opinion of the international Searching Authority (Forms PCT/ISA/210, PCT/ISA/220, and PCT/ ISA/237) dated Sep. 27, 2015, by the State Intellectual Property Office of People's Republic of China in corresponding International Application No. PCT/CN2015/086122. (11 pages).

(Continued)

*Primary Examiner* — Phuc T Dang
(74) *Attorney, Agent, or Firm* — Mintz Levin Cohn Ferris Glovsky and Popeo, P.C.; Kongsik Kim

(57) ABSTRACT

An LTPS array substrate, a method for manufacturing the same, and a display device are disclosed. According to the method, a flat layer is formed on an electrode. The flat layer is formed through washing, baking to remove water, hydrophobization treatment, photoresist coating, drying in vacuum, pre-baking, exposing, developing, baking, and aching procedures in sequence, and the baking procedure comprises at least baking for twice with different temperatures. According to the method, the organic film of the flat layer can be preliminarily solidified. In this manner, the problem that the taper angle at via hole position is too small, which is resulted from the liquidity of photoresist material of the flat layer, can be solved.

20 Claims, 2 Drawing Sheets

(51) Int. Cl.
  *H01L 27/32* (2006.01)
  *G02F 1/13* (2006.01)
  *H01L 27/12* (2006.01)

(52) U.S. Cl.
  CPC ........ *H01L 27/1259* (2013.01); *H01L 27/153* (2013.01); *H01L 27/3241* (2013.01)

(56) References Cited

U.S. PATENT DOCUMENTS

2011/0281491 A1    11/2011  Nagasawa
2014/0240649 A1*    8/2014  Shen ................ G02F 1/1337
                                              349/106
2016/0268552 A1*    9/2016  Yang ................ H01L 51/5275

FOREIGN PATENT DOCUMENTS

| CN | 102253534 A | 11/2011 |
| CN | 102543861 A | 7/2012 |
| CN | 104658906 A | 5/2015 |
| WO | 2005/050268 A1 | 6/2005 |

OTHER PUBLICATIONS

Office Action dated Aug. 16, 2017, by the State Intellectual Property Office of People's Republic of China in corresponding Chinese Patent Application No. 201510447288.1. (5 pages).

* cited by examiner

LTPS ARRAY SUBSTRATE, METHOD FOR MANUFACTURING THE SAME, AND DISPLAY DEVICE

CROSS REFERENCE TO RELATED APPLICATION

The present application claims priority of Chinese patent application CN 201510447288.1, entitled "LTPS Array Substrate, Method for Manufacturing the Same, and Display Device" and filed on Jul. 27, 2015, the entirety of which is incorporated herein by reference.

FIELD OF THE INVENTION

The present disclosure relates to the technical field of liquid crystal display panel production, and particularly to a Low Temperature Poly-Silicon (LTPS) array substrate, a method for manufacturing the LTPS array substrate, and a display device.

BACKGROUND OF THE INVENTION

Thin Film Transistor (TFT) Liquid Crystal Display (LCD) comprises Poly-Silicon array substrate and amorphous silicon array substrate, and the difference thereof lies in different transistor characteristics. With respect to one grain of the Poly-Silicon, molecules thereof are aligned in an ordered manner along a certain direction, and thus an electron mobility ratio thereof is multiple times of that of amorphous silicon, in which the molecules are in a disordered state. Poly-Silicon products comprise High Temperature Poly-Silicon (HTPS) product and LTPS product.

During the package procedure of an LTPS TFT-LCD, an excimer laser is used as a heat source. The laser, after passing through a refraction system, can generate a laser beam in which the energy distributes in a uniform manner. The laser beam irradiates a glass substrate with amorphous silicon structure, and the glass substrate can be changed into a Poly-Silicon structure after absorbing energy from the excimer laser. The whole procedure is performed at a temperature lower than 600° C., and thus common glass substrates can all be used.

LTPS-LCD has the advantages of high resolution, high response speed, high brightness, high aperture ratio, and the like. In addition, since in the LTPS-LCD, the silicon crystals are aligned in an ordered manner compared with amorphous silicon, the electron mobility ratio thereof can be one hundred times of that of amorphous silicon. A peripheral driving circuit can be manufactured on the glass substrate, and thus the whole system can be integrated. in this manner, the space and a cost of driving Integrated Circuit (IC) can both be saved, a performance of the array substrate can be improved, and a performance of the LCD can be greatly improved.

However, the manufacturing technology of LTPS array substrate is complicated, and a surface thereof can be possibly not flat. As a result, when the LIPS array substrate is integrated with a color filter substrate, spacers thereof would deviate after being pressed, and thus a risk of light leakage would be generate.

SUMMARY OF THE INVENTION

With respect to the aforesaid technical problem in the prior art, the present disclosure provides an LIPS array substrate, a method for manufacturing the same, and a display device. According to the method, a flat layer is arranged, and at least baking for twice with different temperatures shall be performed during the formation of the flat layer, whereby the case that the taper angle arranged on the flat layer is too small can be avoided, and the flatness of a surface of the LIPS array substrate can be ensured. Therefore, according to the present disclosure, the case that the spacers would deviate when LCD is pressed can be avoided, and thus the risk of light leakage otherwise would be generated therein can be avoided accordingly.

According to one aspect, the present disclosure provides a method for manufacturing an LIPS array substrate, comprising forming a flat layer on an electrode, wherein the flat layer is formed through washing, baking to remove water, hydrophobization treatment, photoresist coating, drying in vacuum, pre-baking, exposing, developing, baking, and ashing procedures in sequence and wherein the baking procedure comprises at least baking for twice with different temperatures. According to the present disclosure, an organic film of the flat layer can be preliminarily solidified, and thus the problem that the taper angle thereof is too small can be solved.

According to one embodiment, the baking procedure comprises post-baking and oven baking in sequence; and a temperature of the post-baking is lower than a temperature of the oven baking. According to the above method, the baking procedure comprises at least two baking steps. That is, there is at least one baking step before oven baking, so that the organic film of the flat layer can be preliminarily solidified. In this manner, the problem that the taper angle at via hole position is too small, which is resulted from the liquidity of photoresist material of the flat layer when only oven baking is performed, can be solved. Meanwhile, the technology is relatively simple, and no additional equipment needs to be added.

According to one embodiment, the temperature of the post-baking ranges from 110 to 130° C. Preferably, the temperature of the post-baking is 120° C.

According to one embodiment, a time of the post-baking ranges from 2 to 4 minutes.

According to one embodiment, the temperature of the oven baking ranges from 210 to 230° C.

According to one embodiment, a temperature of the pre-baking ranges from 80 to 100° C., and a time of the pre-baking ranges from 1.5 to 2 minutes.

According to one embodiment, the exposing procedure comprises two steps of middle part exposing and edges exposing.

According to another aspect, the present disclosure provides an LIPS array substrate, which is manufactured through the aforesaid method, According to a third aspect, the present disclosure provides a display device, which comprises the aforesaid LTPS array substrate.

Compared with the prior art, the following advantages can be brought about according to the present disclosure. When the flat layer of the LIPS array substrate is manufactured, the baking procedure comprises at least two baking steps. That is, there is at least one baking step before oven baking, so that the organic film of the flat layer can be preliminarily solidified. In this manner, the problem that the taper angle at via hole position is too small, which is resulted from the liquidity of photoresist material of the flat layer when only oven baking is performed, can be solved. Since the problem that the taper angle is too small can be solved, during the package procedure of the array substrate that is manufactured through this method and a color filter substrate, the problem that the spacers would otherwise deviate can be solved, and thus the risk of light leakage thereof can be reduced.

BRIEF DESCRIPTION OF THE DRAWINGS

The preferred embodiments of the present disclosure will be illustrated in detail hereinafter with reference to the drawings. In the drawings.

The drawings are not drawn according to actual scale.

DETAILED DESCRIPTION OF THE EMBODIMENTS

The present disclosure will be further illustrated hereinafter with reference to the drawings.

Figure 1:
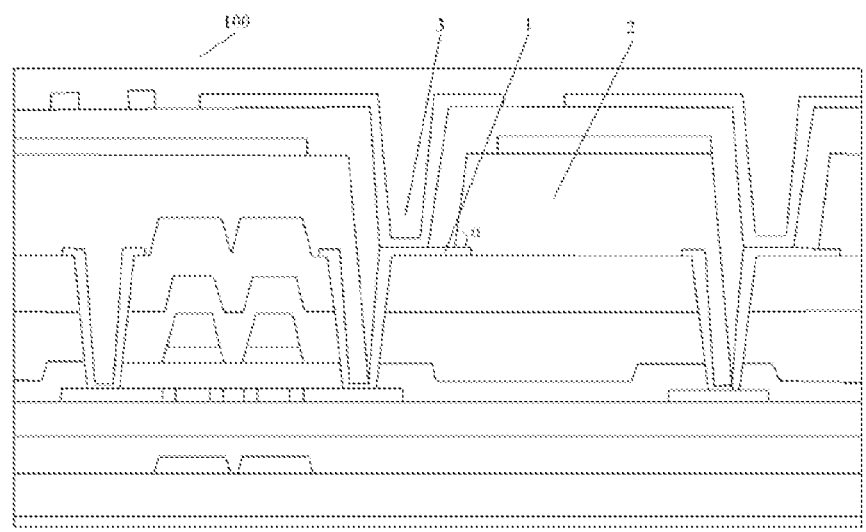
FIG. 1 schematically shows a structure of an LIPS array substrate according to the present disclosure.

FIG. 1 schematically shows an LTPS array substrate 100. As shown in FIG. 1, during the manufacturing of the LTPS array substrate 100, after an electrode 1 is arranged, a flat layer 2 should be formed on a whole surface of the electrode 1 of the UPS array substrate 100. In order to play the role of flattening, the flat layer 2 is made of organic material, such as polyimide. Via holes 3 are arranged in the flat layer 2 of the electrode 1, so that signal lines can pass therethrough. The cross section of via hole 3 is roughly a trapezoid, and the inclined surface of the via hole 3 and the surface of the electrode 1 forms an angle (taper angle, i.e., the angle α as shown in FIG. 1). When the LIPS array substrate 100 is affixed to a color filter substrate (not shown in FIG. 1), a spacer is arranged between via holes 3 of the flat layer 2.

In the prior art, when LTPS array substrate 100 is manufactured, high temperature baking is directly performed after developing procedure. During the high temperature baking procedure, the problem that the taper angle α is too small would usually occur due to the liquidity of photoresist material of the flat layer 2. Since the taper angle α is too small, the flat layer 2 between two via holes 3 would possibly not flat, but instead has a curved surface. When the LTPS array substrate 100 is integrated with the color filter substrate, a spacer is arranged between two via holes 3 of the LTPS array substrate 100. If the surface of the flat layer 2 between two via holes 3 is not flat, the spacer would deviate when being pressed, and the risk of light leakage would be generated. Therefore, when the LTPS array substrate 100 is manufactured, the baking procedure can comprise at least baking for twice with different temperatures. That is, before oven baking is performed on the LTPS array substrate 100, a post-baking can be performed, and a temperature of the post-baking is lower than a temperature of the oven baking. The flat layer 2 can be solidified through the post-baking step, so that the problem that the taper angle α at via hole position 3 is too small, which is resulted from the liquidity of photoresist material of the flat layer 2 when only oven baking is performed, can be solved. In this manner, according to the method for manufacturing the LTPS array substrate 100, the problem that the taper angle α at via hole position 3 is too small can be solved, so that the flat layer 2 between via holes 3 has a flat surface, and the display effect of the LTPS array substrate 100 can be ensured.

Figure 2:
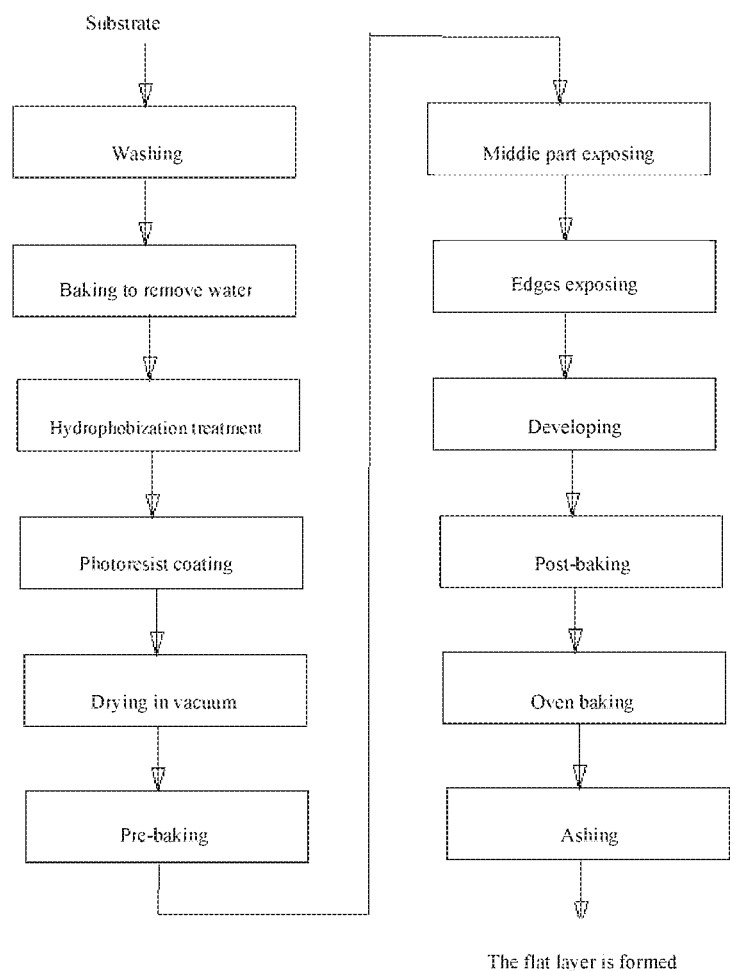
FIG. 2 is a flow chart of a method for manufacturing the LIPS array substrate according to the present disclosure.

The procedures for manufacturing the flat layer 2 will be illustrated in detail hereinafter with reference to FIG. 2.

The LTPS array substrate 100 is washed after the electrode 1 is formed. The surface of the LTPS array substrate 100 would be polluted to some extent during manufacturing and transmission procedures. The pollution particles would cause defects in the circuit, and thus the performance of the components would deteriorate. A washing procedure is needed in order to remove the pollution. The washing procedure can be performed with water, ultraviolet, ultrasound, and the like.

The LTPS array substrate 100 is baked to remove water after being washed, so that residual water marks or impurities on the surface of the LTPS array substrate 100 can be removed. The procedure can be performed through air knife drying, swinging drying, and the like.

A hydrophobization treatment is performed on the LTPS array substrate 100 before photoresist coating procedure, so that the surface thereof can be better affixed to the flat layer 2 in following steps.

Then, the photoresist coating procedure is performed. That is, a surface of the electrode 1 of the LTPS array substrate 100 is coated with an organic film layer so as to form the flat layer 2. The spinning coating or capillary coating method can be used.

The LTPS array substrate 100 is dried in vacuum so that the organic solvent coated therein can volatilize. In the following, a pre-baking procedure is performed. That is, the LTPS array substrate 100 is pre-baked under a temperature ranging from 80 to 100 for 1.5 to 2 minutes. Preferably, the temperature of pre-baking can be set to be 90° C.

Next, an exposing procedure is performed. In order to control circuit diagram and. pixel diagram for image display, the exposing procedure comprises two steps of middle part exposing and edges exposing according to different exposing positions.

In order to form the diagram after exposing procedure, part of the organic film layer needs to be removed in a selective manner. That is, a developing procedure is performed after the exposing procedure, and spraying developing, dipping developing, or spinning developing method can be used.

Then, another baking procedure is performed. According to the present disclosure, the baking procedure comprises at least baking for twice with different temperatures. That is, at least one post-baking is added before oven baking, so that the organic film layer can be preliminarily solidified, and the problem that the taper angle is too small can be solved. Preferably, the temperature of the post-baking ranges from 110 to 130 and a time of the post-baking ranges from 2 to 4 minutes. For example, the LIPS array substrate 100 can be baked at a temperature of 120° C. for 2.5 minutes. After that, the LTPS array substrate 100 is baked in an oven. The temperature of the oven baking ranges from 210 to 230° C., and a baking time thereof ranges from 35 to 50 minutes.

At last, the via holes 3 are modified, i.e., an ashing treatment is performed. Up until now, the manufacturing of the flat layer 2 of the LIPS array substrate 100 is completed.

The present disclosure further relates to an LIPS array substrate 100 that is manufactured through the aforesaid method. Other structures and components of the LIPS array substrate 100 are well known to those skilled in the art, and the details of which are no longer repeated here.

The present disclosure further provides a display device which comprises the LIPS array substrate 100.

The preferred embodiments of the present disclosure are stated hereinabove, but the protection scope of the present disclosure is not limited by this. Any changes or substitutes readily conceivable for those skilled in the art within the technical scope disclosed herein shall be covered by the protection scope of the present disclosure. Therefore, the protection scope of the present disclosure shall be determined by the scope as defined in the claims.

The invention claimed is:
1. A method for manufacturing an LTPS array substrate, comprising forming a flat layer on an electrode,
wherein the flat layer is formed through washing, baking to remove water, hydrophobization treatment, photoresist coating, drying in vacuum, pre-baking, exposing, developing, baking, and ashing procedures in sequence; and
wherein the baking procedure comprises at least baking for twice with different temperatures.
2. The method according to claim 1,
wherein the baking procedure comprises post-baking and oven baking in sequence; and
wherein a temperature of the post-baking is lower than a temperature of the oven baking.
3. The method according to claim 2, wherein the temperature of the post-baking ranges from 110 to 130° C.
4. The method according to claim 3, wherein the temperature of the post-baking is 120° C.
5. The method according to claim 4, wherein a time of the post-baking ranges from 2 to 4 minutes.
6. The method according to claim 2, wherein the temperature of the oven baking ranges from 210 to 230° C.
7. The method according to claim 3, wherein the temperature of the oven baking ranges from 210 to 230° C.
8. The method according to claim 4, wherein the temperature of the oven baking ranges from 210 to 230° C.
9. The method according to claim 5, wherein the temperature of the oven baking ranges from 210 to 230° C.
10. The method according to claim 6, wherein a temperature of the pre-baking ranges from 80 to 100° C., and a time of the pre. baking ranges from 1.5 to 2 minutes.
11. The method according to claim 1, wherein the exposing procedure comprises two steps of middle part exposing and edges exposing.
12. An LIPS array substrate,
wherein the LTPS array substrate is manufactured through the following method:
the method comprises forming a flat layer on an electrode,
wherein the flat layer is formed through washing, baking to remove water, hydrophobization treatment, photoresist coating, drying in vacuum, pre-baking, exposing, developing, baking, and aching procedures in sequence; and
wherein the baking procedure comprises at least baking for twice with different temperatures.
13. The LIPS array substrate according to claim 12,
wherein the baking procedure comprises post-baking and oven baking in sequence; and
wherein a temperature of the post-baking is lower than a temperature of the oven baking.
14. The LIPS array substrate according to claim 13, wherein the temperature of the post-baking ranges from 110 to 130° C.
15. The LIPS array substrate according to claim 14, wherein the temperature of the post-baking is 120° C.
16. The LTPS array substrate according to claim 15, wherein a time of the post-baking ranges from 2 to 4 minutes.
17. The LIPS array substrate according to claim 13, wherein the temperature of the oven baking ranges from 210 to 230° C.
18. The LIPS array substrate according to claim 17, wherein a temperature of the pre-baking ranges from 80 to 100° C., and a time of the pre-baking ranges from 1.5 to 2 minutes.
19. The LTPS array substrate according to claim 12, wherein the exposing procedure comprises two steps of middle part exposing and edges exposing.
20. A display device, comprising an LIPS array substrate,
wherein the LIPS array substrate is manufactured through the following method:
the method comprises forming a flat layer on an electrode,
wherein the flat layer is formed through washing, baking to remove water, hydrophobization treatment, photoresist coating, drying in vacuum, pre-baking, exposing, developing, baking, and ashing procedures in sequence; and
wherein the baking procedure comprises at least baking for twice with different temperatures.

* * * * *